United States Patent
Werker et al.

(10) Patent No.: US 12,424,797 B2
(45) Date of Patent: Sep. 23, 2025

(54) EMC FILTER PLUG-IN ARRANGEMENT

(71) Applicant: Hanon Systems, Daejeon (KR)

(72) Inventors: Stephan Werker, Merzenich-Golzheim (DE); Sandra Moravek, Wetzlar (DE); Roland Robrecht, Neuss (DE)

(73) Assignee: HANON SYSTEMS, Daejeon (KR)

( * ) Notice: Subject to any disclaimer, the term of this patent is extended or adjusted under 35 U.S.C. 154(b) by 346 days.

(21) Appl. No.: 17/756,103

(22) PCT Filed: Feb. 4, 2021

(86) PCT No.: PCT/KR2021/001445
§ 371 (c)(1),
(2) Date: May 17, 2022

(87) PCT Pub. No.: WO2021/167271
PCT Pub. Date: Aug. 26, 2021

(65) Prior Publication Data
US 2022/0407390 A1    Dec. 22, 2022

(30) Foreign Application Priority Data
Feb. 17, 2020  (DE) .................. 10 2020 104 106.3

(51) Int. Cl.
*H01R 13/66*    (2006.01)
*H01R 13/719*   (2011.01)

(52) U.S. Cl.
CPC ......... *H01R 13/665* (2013.01); *H01R 13/719* (2013.01)

(58) Field of Classification Search
CPC ............ H01R 13/6582; H01R 13/6581; H01R 13/6583; H01R 13/658; H01R 13/6594;
(Continued)

(56) References Cited

U.S. PATENT DOCUMENTS

| 8,939,739 B2 | 1/2015 | Kinoshita et al. |
| 2013/0154766 A1 | 6/2013 | Beck et al. |

(Continued)

FOREIGN PATENT DOCUMENTS

| CN | 103270696 A | 8/2013 |
| CN | 109494974 A | 3/2019 |

(Continued)

OTHER PUBLICATIONS

WO 2019086350 NPL Translation.*

*Primary Examiner* — Bryan R Perez
(74) *Attorney, Agent, or Firm* — Shumaker, Loop & Kendrick, LLP; James D. Miller

(57) ABSTRACT

An EMC filter plug-in arrangement with an EMC filter to avoid or reduce electrical and/or electromagnetic interference caused by an electronic component, in particular an inverter of a refrigerant compressor. The EMC filter plug-in arrangement has an EMC filter, a plug-in housing formed for receiving the EMC filter and having electrical conductor contacts formed on the outside which are in electrical contact with the EMC filter, and a plug-in receptacle formed for arrangement with an electronic component into which the plug-in housing can be plugged in to provide electrical contact between the EMC filter and the electronic component.

13 Claims, 2 Drawing Sheets

(58) Field of Classification Search
CPC .......... H01R 13/6596; H01R 13/5219; H01R 13/6273; H01R 13/6464; H01R 13/648; H01R 13/6592; H01R 13/6691; H01R 13/6275; H01R 13/6474; H01R 13/6584; H01R 13/6587

See application file for complete search history.

(56) References Cited

U.S. PATENT DOCUMENTS

| | | | |
|---|---|---|---|
| 2013/0222078 | A1 | 8/2013 | Beck |
| 2016/0231375 | A1* | 8/2016 | Roemer ............... H02H 1/0015 |
| 2016/0359248 | A1* | 12/2016 | Klose ................... H01R 12/585 |
| 2020/0235631 | A1* | 7/2020 | Wisner .................. H01R 12/53 |

FOREIGN PATENT DOCUMENTS

| | | | | |
|---|---|---|---|---|
| CN | 110417280 | A | 11/2019 | |
| JP | 2012-069353 | A | 4/2012 | |
| KR | 1020190029420 | A | 3/2019 | |
| KR | 1020190125931 | A | 3/2019 | |
| WO | 2019086350 | A | 10/2018 | |
| WO | WO-2019086350 | A1 * | 5/2019 | ......... H01R 13/6464 |

\* cited by examiner

EMC FILTER PLUG-IN ARRANGEMENT

CROSS REFERENCE TO RELATED APPLICATIONS

This is a U.S. national phase patent application of PCT/KR2021/001445 filed Feb. 4, 2021 which claims the benefit of and priority to German Pat. Appl. No. 10 2020 104 106.3 filed on Feb. 17, 2020, the entire contents of each of which are incorporated herein by reference.

TECHNICAL FIELD

The invention relates to an EMC filter plug-in arrangement with an EMC filter to avoid or reduce electrical and/or electromagnetic interference caused by an electronic component, in particular an inverter of a refrigerant compressor.

BACKGROUND ART

The operation of electronic components may, in particular during switching processes, have interfering electrical or electromagnetic influences on other electronic components. The ability of an electronic component to reduce or avoid electrical or electromagnetic interference on other electronic components or electronic devices, is defined with the electromagnetic compatibility (EMC). In order not to interfere with other electronic components through unwanted electrical or electromagnetic effects or being subjected to interference through other electronic components, the use of so-called EMC filters is provided, which are electronic filter circuits and which are suitable to compensate or reduce electrical and electromagnetic interference. EMC filters can, for example, have electrical chokes, such as common mode chokes (CMC) or current-compensated chokes and electrical interference-suppression capacitors. Interference-suppression capacitors, also referred to as radio interference-suppression capacitors, are used for radio interference suppression by shorting high-frequency interference signals or discharging them to a neutral conductor so that the high-frequency interference radiation is avoided. Radio interference-suppression capacitors are distinguished in classes X and Y. According to the IEC 60384-1 standard, class X radio interference-suppression capacitors are connected between a phase and a neutral conductor or between two phases. Class X radio interference-suppression capacitors are prescribed for applications in which failure due to a short circuit cannot lead to a dangerous electric shock. According to the IEC 60384-1 standard, class Y radio interference-suppression capacitors are connected between a phase or a neutral conductor and a touchable earthed housing.

EMC filters are usually electrically arranged between a voltage supply, for example a high-voltage terminal and an electronic component, wherein the EMC filter and the electronic component together are soldered on a circuit board. The components and filter circuits that define the EMC filter are integrated in the electronic component as a permanent component. In the case of inverters or converters for electrical refrigerant compressors, it is common to integrate an EMC filter into the circuit of the inverter on a common circuit board in order to dissipate or cancel out interferences via the shortest possible electrical path.

Electronic components with integrated EMC filters have the disadvantage that in the event of a required replacement or an adjustment of the electronic component, the integrated EMC filter in each case must be replaced or adjusted as well due to lack of possibility for decoupling from the common circuit board. Conversely, if the EMC filter of an electronic component is faulty, the entire electronic component, which is often still intact, must be replaced. Both cases stand in the way of responsible and economical use of available resources.

SUMMARY

It is therefore the object of the invention to propose a possibility for simple and error-free coupling and decoupling between an EMC filter and an electronic component.

The object is achieved by an EMC filter plug-in arrangement with the features as shown and described herein.

The EMC filter plug arrangement according to the invention has an EMC filter to avoid or reduce electrical and/or electromagnetic interference caused by an electronic component, in particular an inverter of a refrigerant compressor. Furthermore, the EMC filter plug-in arrangement has a plug-in housing formed for receiving the EMC filter. Electrical conductor contacts are formed on the outside of the plug-in housing, which are in electrical contact with the EMC filter. Another part of the plug-in arrangement according to the invention is a plug-in receptacle formed for arrangement with an electronic component, into which the plug-in housing can be plugged in to provide electrical contact between the EMC filter and the electronic component.

The electrical conductor contacts formed on the outside are provided in order to electrically connect the EMC filter received by the plug-in housing between an electronic component and a voltage supply, for example a high-voltage supply. In this case, the plug-in housing has at least four electrical conductor contacts formed on the outside, wherein at least two of the electrical conductor contacts are provided for electrically contacting the electronic component, to establish an electrical contact between the EMC filter and the electronic component. Expediently, the plug-in receptacle is formed at the electronic component in such a way that, when the plug-in housing is plugged in, electrical contact is made possible between at least two of the electrical conductor contacts of the plug-in housing formed on the outside of the plug-in housing with electrical conductor contacts of the electronic component. The further conductor contacts formed on the outside can be connected to a voltage supply for contacting.

The electrical conductor contacts formed on the outside of the plug-in housing, which are provided for electrically contacting the electronic component, can be referred to as component-side electrical conductor contacts, wherein the electrical conductor contacts formed on the outside of the plug-in housing, which are provided for electrically contacting a voltage supply, can be referred to as mains-side electrical conductor contacts.

By receiving the EMC filter in a plug-in housing which is plugged in the plug-in receptacle formed at an electronic component for electrically contacting, the electronic component and the EMC filter advantageously can be replaced separately, so that a further operation of functioning components or a modification of the requirements of the EMC filter can be realized without having to replace both components in their entirety. Because the EMC filter with the plug-in housing can be decoupled from the electronic component, the EMC filter can be used several times. The use of a plug-in receptacle at the electronic component enables the requirements for an EMC filter to be easily adapted by simply replacing the EMC filter.

According to a configuration of the plug-in housing, the electrical conductor contacts formed on the outside can be flexible or formed in the form of spring elements. Preferably, at least the electrical conductor contacts formed on the component side of the plug-in housing are flexible or formed in the form of spring elements. The electrical conductor contacts formed to be flexible or springy cause the plug-in housing to be preloaded against the plug-in receptacle. The compressive force exerted on the electrical conductor contacts by the preloading ensures safe and tolerance-compensating electrically contacting between the electrical conductor contacts of the plug-in housing and the electrical conductor contacts of the electronic component. Furthermore, the preload between the plug-in housing and the plug-in receptacle, which is exerted by the electrical conductor contacts formed to be flexible or springy, ensures easier decoupling of the plug-in housing from the plug-in receptacle. The spring elements can be formed to be z shaped, zigzag-shaped or meander-shaped bent metal elements as well as coil springs. The component-side electrical conductor contacts formed on the outside are preferably formed on an end face of the plug-in housing.

For electrically contacting the plug-in housing with the voltage supply, the plug-in housing can have a voltage plug-in terminal, in particular a high-voltage plug-in terminal, by means of which the EMC filter is in electrical contact via at least two of the electrical conductor contacts formed on the outside. The mains-side electrical conductor contacts can be formed to be rigid, flexible or in the form of spring elements.

The EMC filter has at least one electrical filter circuit. According to the intended use, the EMC filter can have several separate electrical filter circuits or several combined electrical filter circuits. In the event that the EMC filter has several electrical filter circuits, further electrical conductor contacts can be formed at the plug-in housing, which are in electrical contact with the EMC filter. The further electrical conductor contacts can be electrically contacted to the outside directly or by means of electrically conductive connecting means or electrically conductive attachment means.

According to a configuration of the invention, the plug-in housing can have openings and/or holes, in which electrical conductor contacts in electrical contact with the EMC filter are formed. In this case, the electrical conductor contacts can be formed in the form of sleeves arranged in the openings and made of an electrically conductive material, preferably copper.

According to a further advantageous configuration of the invention, the plug-in housing can have a stop flange. The stop flange is used for the fitting arrangement and spacing of the plug-in housing in the plug-in receptacle. In other words, the stop flange is formed in such a way that it corresponds functionally to the shape of the plug-in receptacle and thereby defines the plug-in depth of the plug-in housing in the plug-in receptacle. In the stop flange openings with sleeve-shaped electrical conductor contacts can be formed, wherein the sleeve-shaped electrical conductor contacts are in electrical contact with the EMC filter. The openings are provided for attaching the plug-in housing to the plug-in receptacle by means of screws, the screws passed through the openings in each case being screwed into a thread formed in the plug-in receptacle or in a circuit board of the electronic component. The use of rivets is also conceivable.

Furthermore, provision can be made that the plug-in housing can be attached to the plug in receptacle by means of electrically conductive attachment means, preferably by means of electrically conducting screws which are passed through the openings, the electrical conductor contacts formed in the openings being in electrical contact with electrical conductor contacts formed on the electronic component. In this case, the electrically conductive attachment means are used for electrically contacting the EMC filter with the electronic component. In this way, electrical contact and attachment or coupling between the EMC filter and the electronic component can advantageously be achieved at the same time. Electrical decoupling can be achieved by detaching or removing the electrically conductive attachment means. In various configurations of the plug-in housing with electrical conductor contacts formed in openings, provision can be made that the material of the plug-in housing is preferably electrically nonconductive or electrically insulating. The plug-in housing is preferably made of plastic.

According to various configurations of the EMC filter plug-in arrangement, the EMC filter can be received by the plug-in housing, the EMC filter being arranged at the plug-in housing or in the plug-in housing. According to other various configurations the plug-in housing can be made of a casting compound, preferably plastic casting compound, the EMC filter being enclosed by the casting compound or received by the casting compound.

According to further different configurations, the plug-in housing can be made of a metal material.

The plug-in receptacle can be formed from a metal material or a plastic. The plug-in receptacle can be attached to the electronic component independently. Attachment to the circuit board is conceivable. Further, provision can be made, that the plug-in receptacle is integrated in a housing for an electronic component, the plug-in receptacle being formed as a part of the housing for the electronic component. Preferably, the plug-in receptacle can be formed at the electronic component in such a way that the plug-in direction of the plug-in housing is aligned orthogonally to the main circuit board of the electronic component.

The EMC filter plug-in arrangement is preferably formed in such a way that the outer shape of the plug-in housing and the inner shape of the plug-in receptacle correspond with each other according to the Poka-Yoke principle. Hence, based on the Poka-Yoke principle, there is only a single specific plug-in option for electrically contacting the EMC filter, so that the coupling between the EMC filter and the electronic component is simplified and assembly errors can be avoided.

The EMC filter plug-in arrangement has the following additional advantages:

The EMC filter plug-in arrangement enables multiple uses of an EMC filter.

Selective soldering of the EMC filter or individual filter components is not required. By forming the electrical conductor contacts formed on the outside of the plug-in housing as spring contacts, tolerance compensation can be made possible.

The electrical conductor contacts formed as spring contacts enable a simplified disassembly or decoupling between plug-in housing and plug-in receptacle.

BRIEF DESCRIPTION OF DRAWINGS

Further details, features and advantages of configurations of the invention become apparent from the following description of exemplary embodiments with reference to the associated drawings.

DESCRIPTION OF AN EMBODIMENT

Figure 1:
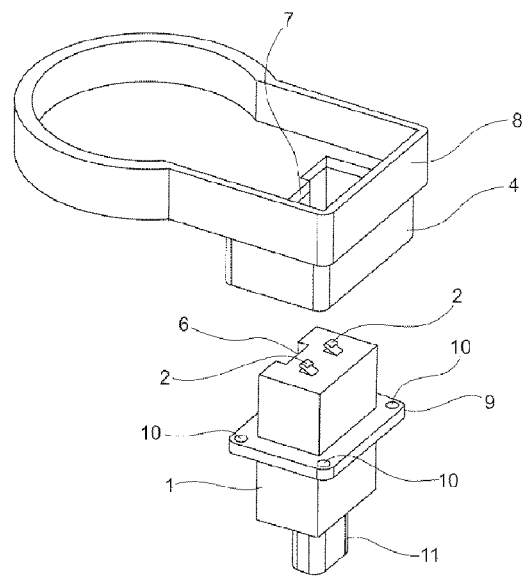
FIG. 1: shows a schematic illustration of a configuration of an EMC filter plug-in arrangement in the decoupled state.

In FIGS. 1 to 4, recurring features are identified with the same reference numerals.

FIG. 1 shows a schematic illustration of a configuration of an EMC filter plug-in arrangement having a plug-in housing 1 formed for receiving an EMC filter and a plug-in receptacle 4 formed at a housing 8 for an electronic component 3 (FIG. 4), in which the plug-in housing 1 can be plugged in. In FIG. 1, the plug-in housing 1 and the plug-in receptacle 4 are illustrated in the decoupled state.

Figure 4:
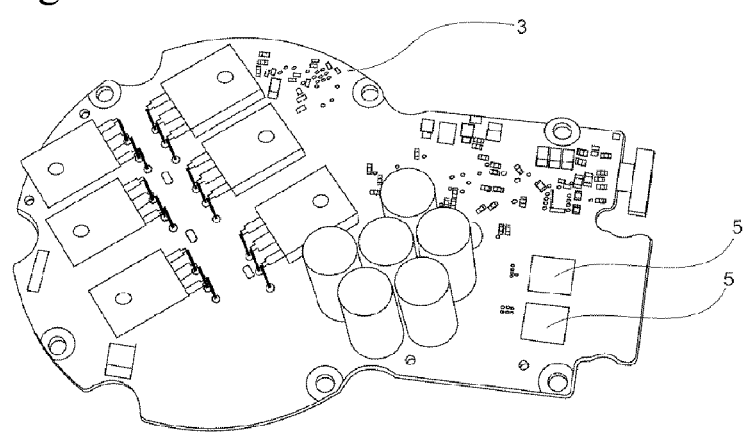
FIG. 4: shows an electronic component for coupling with an EMC filter.

Another component of the EMC filter plug-in arrangement is an EMC filter, which is formed to avoid or reduce electrical and/or electromagnetic interference caused by an electronic component 3 (FIG. 4). In FIG. 1, the EMC filter is arranged within the plug in housing 1 so that it is not visible and can be contacted electrically via electrical conductor contacts 2, which are formed at the end face on the outside of plug-in housing 1. The electrical conductor contacts 2 formed at the end face on the outside of the plug-in housing 1 are provided for electrically contacting electrical conductor contacts 5 of the electronic component 3 shown in FIG. 4. In the configuration shown, the electrical conductor contacts 2 formed on the outside are formed in the form of metal strips bent in a z-shape. The z-shaped shaping of the electrical conductor contacts 2 formed on the outside enables a flexible yielding in the plug-in direction of the plug-in housing 1. According to a configuration of the EMC filter plug-in arrangement, the electrical conductor contacts 2 formed on the outside can be formed in the form of coil springs.

Figure 3:
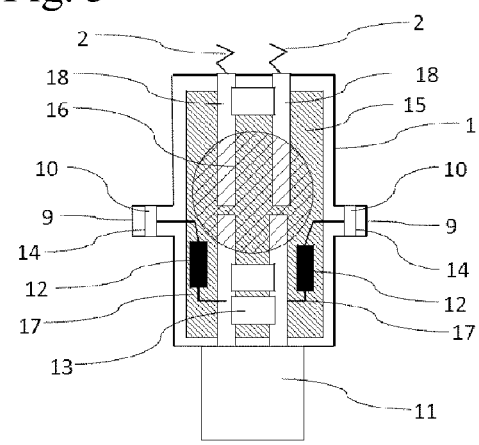
FIG. 3: shows a schematic sectional illustration of a configuration of a plug-in housing with an EMC filter.

On the outer circumference side, the plug-in housing 1 has a stop flange 9, which is provided as a stop against the plug-in receptacle 4. Hereby, the stop flange 9 defines the required plug-in depth into the plug-in receptacle 4. The stop flange 9 has four openings 10, which are aligned in the plug-in direction of the plug-in housing 1. The openings 10 are provided to attach the plug-in housing 1 to the plug-in receptacle 4 by attachment means that can be pushed through the openings 10, such as, for example, screws. Electrical conductor contacts which are in electrical contact with the EMC filter and are described in more detail in FIG. 3 are arranged within the openings 10.

The reference numeral 11 denotes a high-voltage plug-in terminal which has electrical conductor contacts that are illustrated invisibly in FIG. 1 which are in electrical contact with the EMC filter arranged in the interior of the plug-in housing 1. The high-voltage plug in terminal 11 is provided for contacting the EMC filter with a voltage supply.

In the configuration of the EMC filter plug-in arrangement shown in FIG. 1, the plug-in receptacle 4 is formed as a component of a housing 8 provided for the electronic component 3 shown in FIG. 4. The plug-in receptacle 4 is thus integrated in the housing 8 of the electronic component 3. In this case, the plug-in receptacle 4 is arranged in the housing 8 in such a way that the electrical conductor contacts 2 formed on the outside at the plug-in housing 1 can be electrically contacted in the plugged-in state with the electrical conductor contacts 5 of the electronic component 3 arranged in the housing 8.

The outer shape of the plug-in housing 1 and the inner shape of the plug-in receptacle 4 are formed according to the Poka-Yoke principle. The plug-in housing 1 has a recess 6, which corresponds to a nose 7, which is formed in the plug-in receptacle 4. The recess 6 extends over the plug-in depth of the plug-in side of the plug-in housing 1 to the stop flange 9, which defines the plug-in depth for the plug-in housing 1 through its position. Since the recess 6 is only formed on one side of the plug-in housing 1, the plug-in direction and plug-in arrangement for plugging in the plug-in housing 1 into the plug-in receptacle 4 are predetermined, so that coupling errors during assembly are avoided.

Figure 2:
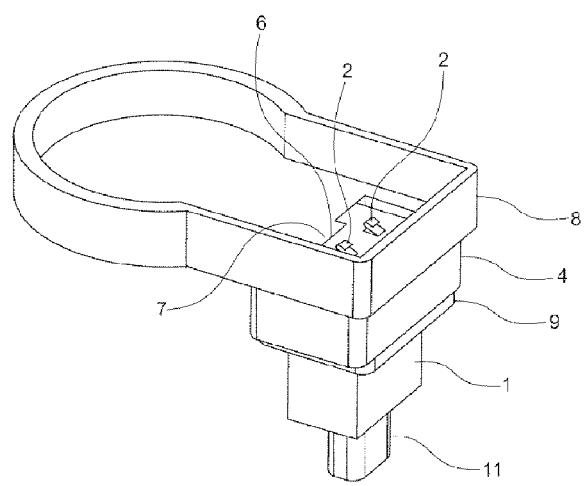
FIG. 2: shows a schematic illustration of a configuration of an EMC filter plug-in arrangement in the coupled state.

FIG. 2 shows a schematic illustration of a configuration of an EMC filter plug-in arrangement in the coupled state without any electronic component. In the state shown in FIG. 2, the plug-in housing 1 is completely plugged into the plug-in receptacle 4 of the housing 8. The geometric configuration of the nose 7 formed in the plug-in receptacle 4 and the recess 6 of the plug-in housing 1 that corresponds geometrically to the nose 7 define the position of the plug-in housing 1 in the plug-in receptacle 4. The stop flange 9 defines the plug-in depth of the plug-in housing 1 in such a way that the end face of the plug-in housing 1 and an inner surface of the housing 8, which is provided as a support for an electronic component 3 (FIG. 4), lie in one plane. In this case, the electrical conductor contacts 2 formed at the end face of the plug-in housing 1 project beyond the inner surface of the housing 8.

FIG. 3 shows a schematic sectional illustration of a configuration of a plug-in housing 1 with EMC filter. The EMC filter has a circuit board 15 which is arranged in the interior of the plug-in housing 1. At the lower end face of the plug-in housing 1, a high-voltage plug in terminal 11 is formed which is in electrical contact with inner electrical bridge conductors 18 of the EMC filter. At the upper end face of the plug-in housing 1, z-shaped electrical conductor contacts 2 projecting beyond the upper end face are formed, which are in electrical contact with the inner electrical bridge conductors 18 of the EMC filter. According to the configuration shown, the EMC filter has class Y interference-suppression capacitors 12 (Y interference-suppression capacitors). The Y interference-suppression capacitors 12 are each in electrical contact with electrical conductor contacts 14 formed in the openings 10 of the stop flange 9 via electrical conductors 17. Furthermore, the Y interference-suppression capacitors 12 are each in electrical contact with one of the inner electrical bridge conductors 18 via electrical conductors 17. The electrical conductor contacts 14 formed in the openings 10 of the stop flange 9 are formed to be sleeve shaped and are used for electrically contacting electrically conductive screws, which, in the assembled or coupled state, are in electrical contact with the electronic component 3 or the housing 8 of the electronic component 3, when the plug-in housing 1 is plugged into the plug-in receptacle 4. The screws thus serve to attach the plug-in housing 1 to the plug-in receptacle 4 and for electrically contacting the Y interference suppression capacitors 12 and the electronic component 3.

The reference numeral 13 denotes a class X interference-suppression capacitor (X interference-suppression capacitor) of the EMC filter. Furthermore, the EMC filter has a current-compensated choke 16. The X interference-suppression capacitor 13 and the current-compensated choke 16 are electrically contacted as elements of the EMC filter.

The electrical conductors 17 for connecting the elements of the EMC filter and the electrical conductor contacts 2 and 14 are formed of copper.

FIG. 4 shows an electronic component 3 that has no EMC filter. The electronic component 3 is a converter (inverter) for an electric refrigerant compressor. The electronic component 3 is provided for being received in the housing 8 shown in FIGS. 1 and 2. If the electronic component 3 is arranged in the housing 8, the electrical conductor contacts 5 are positioned in such a way that the electrical conductor contacts 2 of the plug-in housing 1 plugged into the plug-in receptacle 4 are in electrical contact with the electrical conductor contacts 5.

The invention relates to an EMC filter plug-in arrangement with an EMC filter to avoid or reduce electrical and/or electromagnetic interference caused by an electronic component, in particular an inverter of a refrigerant compressor.

The invention claimed is:

1. An EMC filter plug-in arrangement, comprising:
   an EMC filter to avoid or reduce electrical and/or electromagnetic interference caused by an electronic component;
   a plug-in housing formed for receiving the EMC filter and having first electrical conductor contacts formed on an outside which are in electrical contact with the EMC filter, the plug-in housing having a first end with a first planar end face, a second end opposite the first end of the plug-in housing, and a voltage terminal in electrical contact with the EMC filter and extending outwardly from a second planar end face disposed at the second end of the plug-in housing, wherein the second planar end face is parallel with the first planar end face, and wherein the first electrical conductor contacts are formed on the first planar end face; and
   a plug-in receptacle formed for arrangement with an electronic component, the plug-in receptacle having a recessed first portion for receiving the electronic component and an extended second portion with an aperture formed through the recessed portion and the extended portion, wherein the first end of the plug-in housing is received through the aperture to engage the electronic component, wherein the first electrical conductor contacts of the plug-in housing are in electrical contact with third electrical conductor contacts formed on the electronic component.

2. The EMC filter plug-in arrangement according to claim 1, wherein the first electrical conductor contacts formed on the outside are flexible or are formed in the form of spring elements, and wherein the first electrical conductor contacts are in the form of metal strips bent in a z-shape.

3. The EMC filter plug-in arrangement according to claim 1, wherein the voltage terminal, by means of which the EMC filter is in electrical contact via at least two of the first electrical conductor contacts formed on the outside.

4. The EMC filter plug-in arrangement according to claim 1, wherein the plug-in housing has openings and/or holes in which second electrical conductor contacts in electrical contact with the EMC filter are formed.

5. The EMC filter plug-in arrangement according to claim 1, wherein the plug-in housing has a stop flange with openings formed therein, the flange formed about an external surface of the plug-in housing intermediate the first end of the plug-in housing and the second end of the plug-in housing, wherein sleeve-shaped second electrical conductor contacts are formed in the openings, which are in electrical contact with the EMC filter.

6. The EMC filter plug-in arrangement according to claim 1, wherein the plug-in housing is attachable to the plug-in receptacle by means of electrically conductive attachment means.

7. The EMC filter plug-in arrangement according to claim 1, wherein the plug-in housing is formed from a casting compound, the EMC filter being enclosed by the casting compound.

8. The EMC filter plug-in arrangement according to claim 1, wherein the plug-in receptacle is integrated in a housing for the electronic component.

9. The EMC filter plug-in arrangement according to claim 1, wherein the plug-in receptacle is formed at the electronic component in such a way that a plug-in direction of the plug-in housing is aligned orthogonally to a circuit board of the electronic component.

10. The EMC filter plug-in arrangement according to claim 1, wherein an outer shape of the plug-in housing and an inner shape of the plug-in receptacle correspond with each other according to a Poka-Yoke principle.

11. The EMC filter plug-in arrangement according to claim 1, wherein the EMC filter has at least one current-compensated choke and at least one interference-suppression capacitor.

12. An EMC filter plug-in arrangement, comprising: an EMC filter to avoid or reduce electrical and/or electromagnetic interference caused by an electronic component having electronic component conductor contacts, the EMC filter having a circuit board with bridge conductors, first interference-suppression capacitors in electrical contact with at least one of the bridge conductors, at least one second interference-suppression capacitor extending between the bridge conductors, and a current compensated choke; a plug-in housing formed for receiving the EMC filter and having first electrical conductor contacts formed on an outside which are in direct electrical contact with the bridge conductors of the EMC filter, the plug-in housing having a first end and a second end opposing the first end, the first electrical conductor contacts extending from the first end of the plug-in housing and a voltage terminal in electrical contact with the bridge conductors extending from the second end of the plug-in housing; and
   a plug-in receptacle formed for arrangement with an electronic component having an aperture formed therethrough, into which the plug-in housing can be plugged in to provide direct electrical contact between the EMC filter and the electronic component conductor contacts, wherein the plug-in housing has openings and/or holes in which second electrical conductor contacts in electrical contact with the EMC filter are formed, wherein the interference-suppression capacitors are in electrical communication with the second electrical conductor contacts and disposed intermediate the bridge conductors and the second electrical conductor contacts with respect to a flow of electric current through the circuit board, and wherein the first end of the plug-in housing is received through the aperture.

13. An EMC filter plug-in arrangement, comprising:
   an EMC filter to avoid or reduce electrical and/or electromagnetic interference caused by an electronic component;
   a plug-in housing formed for receiving the EMC filter and having first electrical conductor contacts and a voltage terminal, the first electrical conductor contacts formed on an outside of a first end of the plug-in housing which are in direct electrical contact with the EMC filter and the electronic component and the voltage terminal extending from a second end of the plug-in housing opposite the first end with respect to a lengthwise direction of the plug-in housing, and a plug-in receptacle formed for arrangement with an electronic component, into which the plug-in housing can be plugged in to provide electrical contact between the EMC filter and the electronic component, wherein the plug-in receptacle has an aperture formed therethrough for receiving the first end of the plug-in housing, wherein the plug-in housing has a stop flange formed intermediate the first end of the plug-in housing and the second end of the plug-in housing, the stop flange has openings with sleeve-shaped second electrical conductor contacts being formed in the openings, which are in electrical contact with the EMC filter, wherein the stop flange prevents the second end of the plug-in receptacle from extending into the aperture of the plug-in receptacle, the second electrical conductor contacts configured to electrically contact the electronic component via electrically conductive couplings.

* * * * *